US012588369B2

(12) United States Patent (10) Patent No.: US 12,588,369 B2

Harada (45) Date of Patent: Mar. 24, 2026

(54) DISPLAY DEVICE

(71) Applicant: Magnolia White Corporation, Tokyo (JP)

(72) Inventor: Kenji Harada, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 348 days.

(21) Appl. No.: 18/462,442

(22) Filed: Sep. 7, 2023

(65) Prior Publication Data

US 2023/0422551 A1 Dec. 28, 2023

Related U.S. Application Data

(63) Continuation of application No. PCT/JP2022/000024, filed on Jan. 4, 2022.

(30) Foreign Application Priority Data

Mar. 8, 2021 (JP) ................................. 2021-036475

(51) Int. Cl.
*H10K 59/122* (2023.01)
*H10K 50/125* (2023.01)
(Continued)

(52) U.S. Cl.
CPC ......... *H10K 59/122* (2023.02); *H10K 50/125* (2023.02); *H10K 50/15* (2023.02);
(Continued)

(58) Field of Classification Search
CPC ............. H10K 2102/302; H10K 50/11; H10K 50/125; H10K 50/15; H10K 50/16;
(Continued)

(56) References Cited

U.S. PATENT DOCUMENTS 11,494,017 B2 * 11/2022 Ye .......................... G06F 3/0445
2017/0271421 A1 * 9/2017 Jinbo ................. H10K 59/8722
(Continued)

FOREIGN PATENT DOCUMENTS

JP        2008-135325 A     6/2008
JP        2009-244527 A    10/2009
WO        2012/102218 A1    8/2012

OTHER PUBLICATIONS

International Search Report and Written Opinion mailed on Mar. 29, 2022, received for PCT Application PCT/JP2022/000024, filed on Jan. 4, 2022, 13 pages including English Translation.
(Continued)

*Primary Examiner* — Shaun M Campbell

(74) *Attorney, Agent, or Firm* — XSENSUS LLP

(57) ABSTRACT

According to one embodiment, a display device includes first and second lower electrodes, a second insulating layer including a first trench, a light emitting layer and an upper electrode. The first trench includes first, second and third trench portions. A first gap in a lower portion of the first trench portion is greater than a second gap in an upper portion of the first trench portion, a third gap in a lower portion of the second trench portion is greater than a fourth gap in an upper portion of the second trench portion, and a fifth gap in a lower portion of the third trench portion is greater than a sixth gap in an upper portion of the third trench portion.

14 Claims, 9 Drawing Sheets

(51) Int. Cl.
| | |
|---|---|
| *H10K 50/15* | (2023.01) |
| *H10K 59/12* | (2023.01) |
| *H10K 59/124* | (2023.01) |
| *H10K 59/80* | (2023.01) |
| *H10K 102/00* | (2023.01) |

(52) U.S. Cl.
CPC ....... *H10K 59/1201* (2023.02); *H10K 59/124* (2023.02); *H10K 59/80521* (2023.02); *H10K 59/8731* (2023.02); *H10K 2102/302* (2023.02)

(58) Field of Classification Search
CPC ............. H10K 59/1201; H10K 59/122; H10K 59/124; H10K 59/38; H10K 59/80521; H10K 59/8731; H10K 71/20; G09F 9/30; H05B 33/12; H05B 33/22
See application file for complete search history.

(56) References Cited

U.S. PATENT DOCUMENTS

| | | | |
|---|---|---|---|
| 2018/0301521 A1 | 10/2018 | Yang | |
| 2020/0044001 A1 | 2/2020 | Lim et al. | |
| 2020/0286948 A1* | 9/2020 | Qin | ........................ G02F 1/1333 |
| 2022/0208943 A1* | 6/2022 | Aoki | ..................... H10K 59/131 |
| 2022/0231100 A1* | 7/2022 | Harada | ................ H10K 59/122 |
| 2023/0269971 A1* | 8/2023 | Fukuda | ............ H10K 59/80515 |
| | | | 257/40 |
| 2023/0380222 A1* | 11/2023 | Kinjo | ........................ G09F 9/30 |

OTHER PUBLICATIONS

Japanese Office Action issued Oct. 21, 2025, in corresponding JP Application No. 2023-505138, 10pp.

* cited by examiner

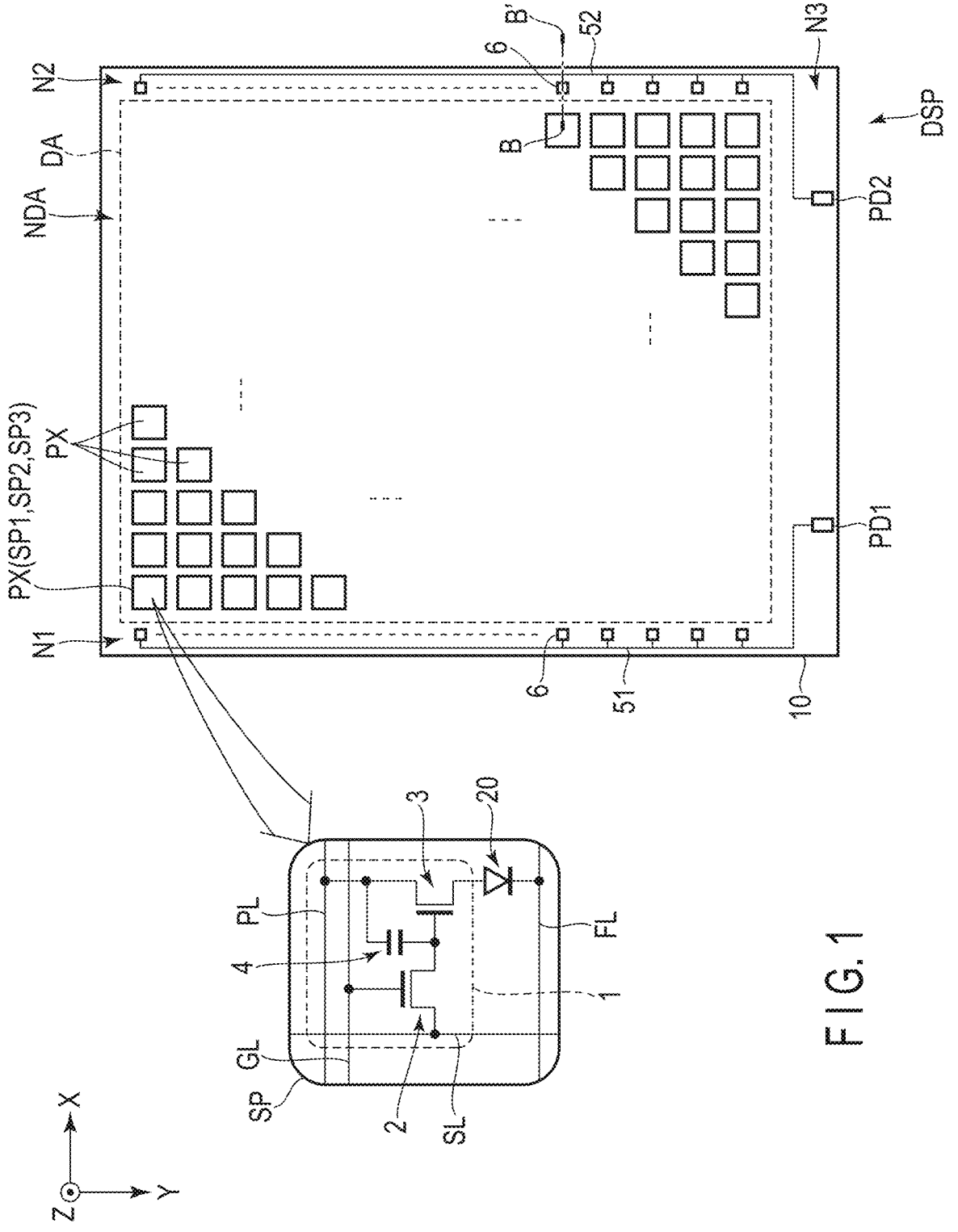
F I G. 1

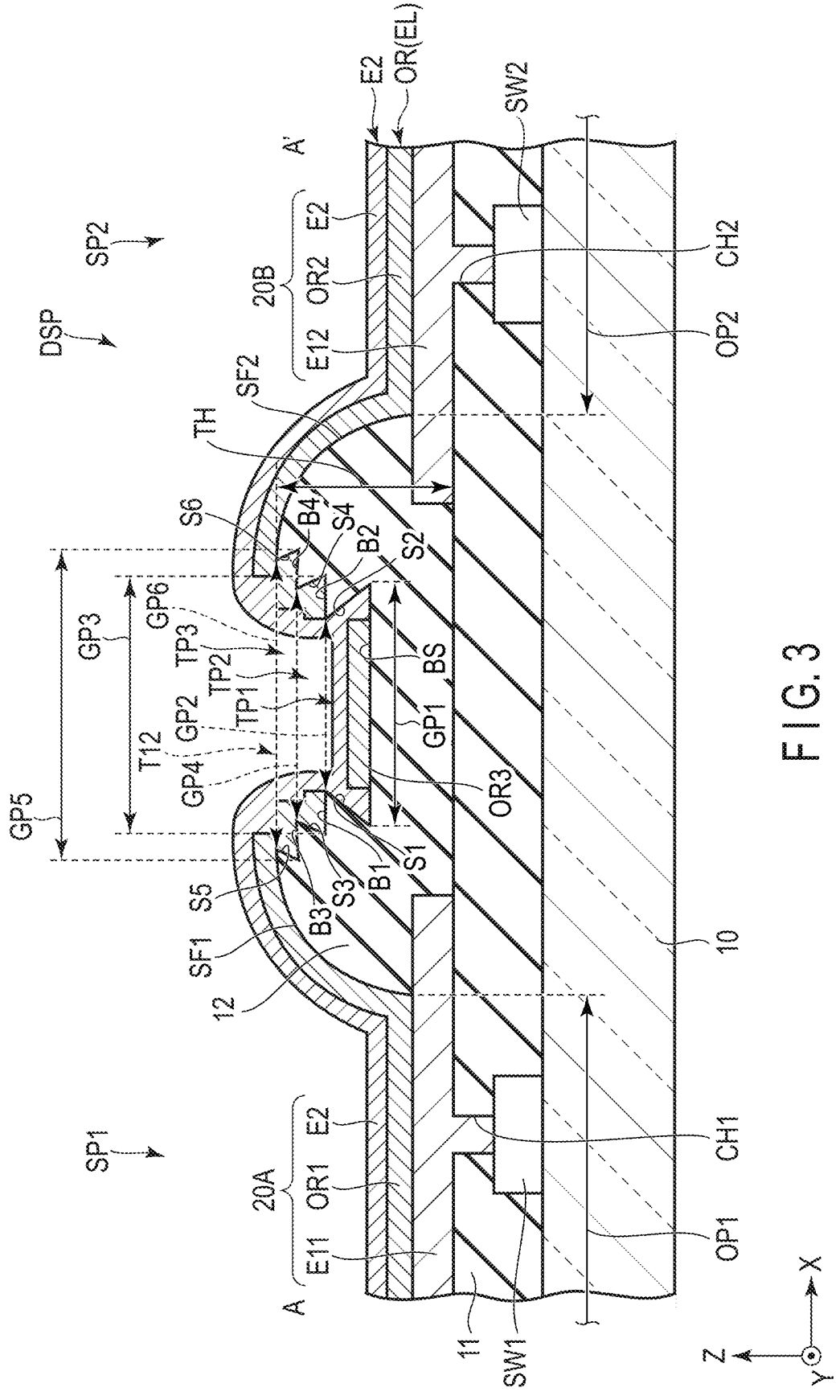
F I G. 3

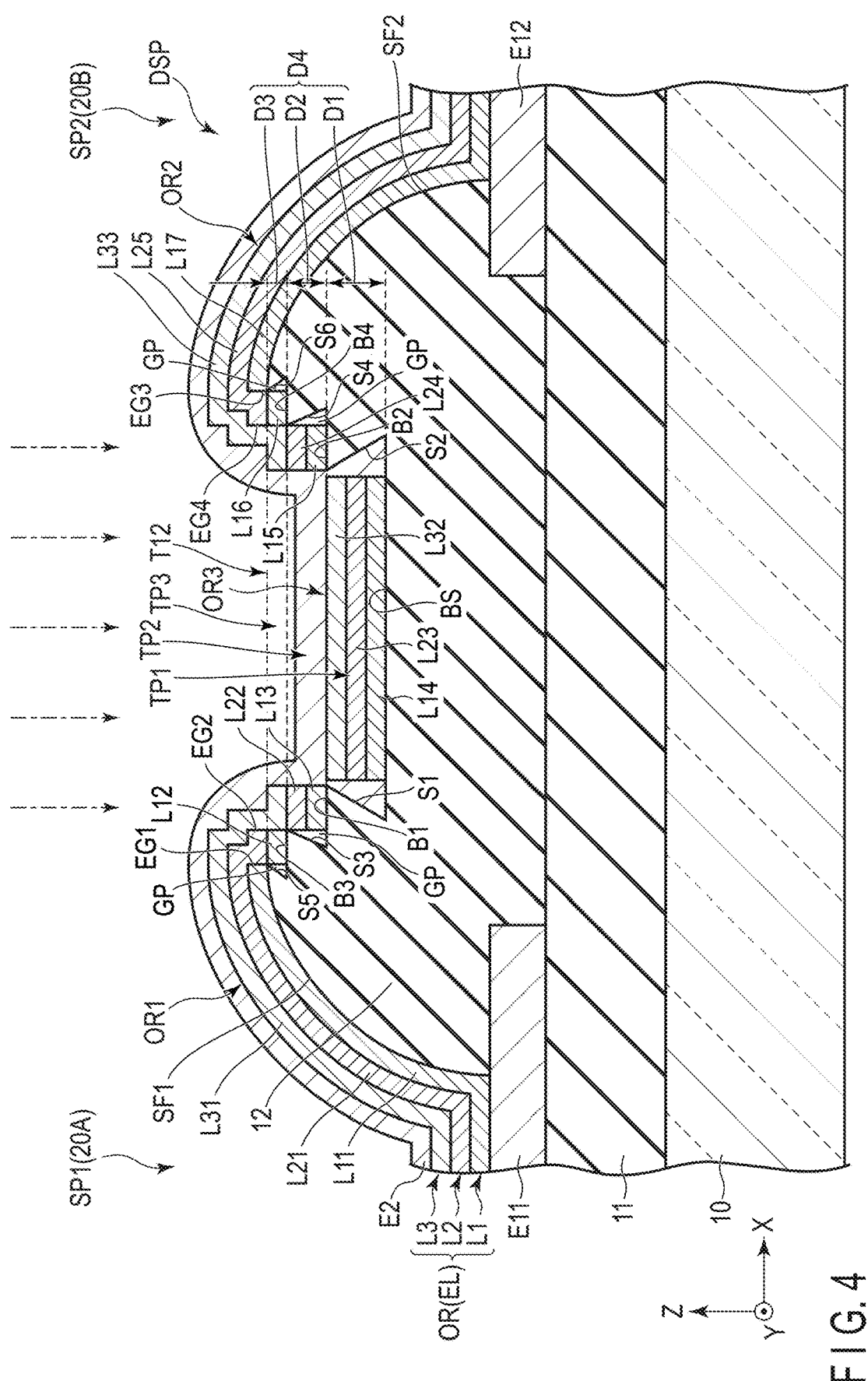
F I G. 4

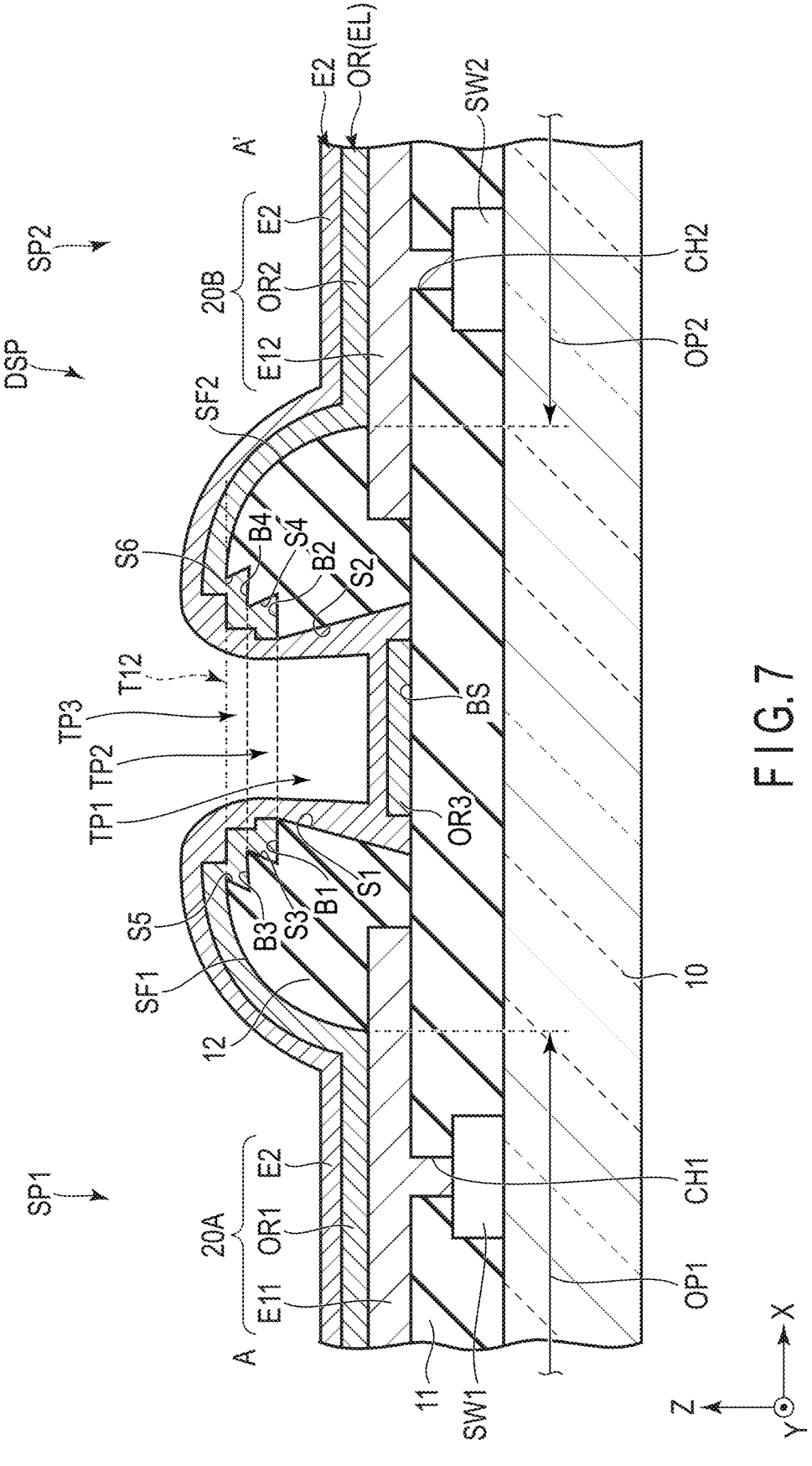
F I G . 7

DISPLAY DEVICE

CROSS-REFERENCE TO RELATED APPLICATIONS

This application is a Continuation Application of PCT Application No. PCT/JP2022/000024, filed Jan. 4, 2022 and based upon and claiming the benefit of priority from Japanese Patent Application No. 2021-036475, filed Mar. 8, 2021, the entire contents of all of which are incorporated herein by reference.

FIELD

Embodiments described herein relate generally to a display device.

BACKGROUND

In recent years, display devices comprising organic light-emitting diodes (OLEDs) applied thereto as display elements have been put to practical use. The display devices comprise an organic layer between a pixel electrode and a common electrode. The organic layer includes functional layers such as a hole transport layer and an electron transport layer in addition to a light-emitting layer. Such an organic layer is formed, for example, by a vacuum evaporation method.

For example, when organic layers are formed by stacking multiple functional layers, there is a risk that other functional layers and light-emitting layers may be exposed from the uppermost functional layer at the peripheral portion of the organic layer and come into contact with the common electrode, resulting in degradation in performance of the display device.

Further, the organic layer should desirably be divided into and arranged in each pixel, for example, to suppress crosstalk between adjacent pixels. Here, a method of forming the organic layer by dividing it into each pixel using a vapor deposition method without using a mask, is being considered.

BRIEF DESCRIPTION OF THE DRAWINGS

FIG. 1 is a plan view showing a configuration example of a display device according to the present embodiment.

FIG. 3 is a cross-sectional view of the display device taken along line A-A' shown in FIG. 2.

FIG. 4 is a cross-sectional view showing a detailed configuration of the organic layer.

FIG. 7 is a cross-sectional view showing a first modified example of this embodiment.

DETAILED DESCRIPTION

Figure 2:
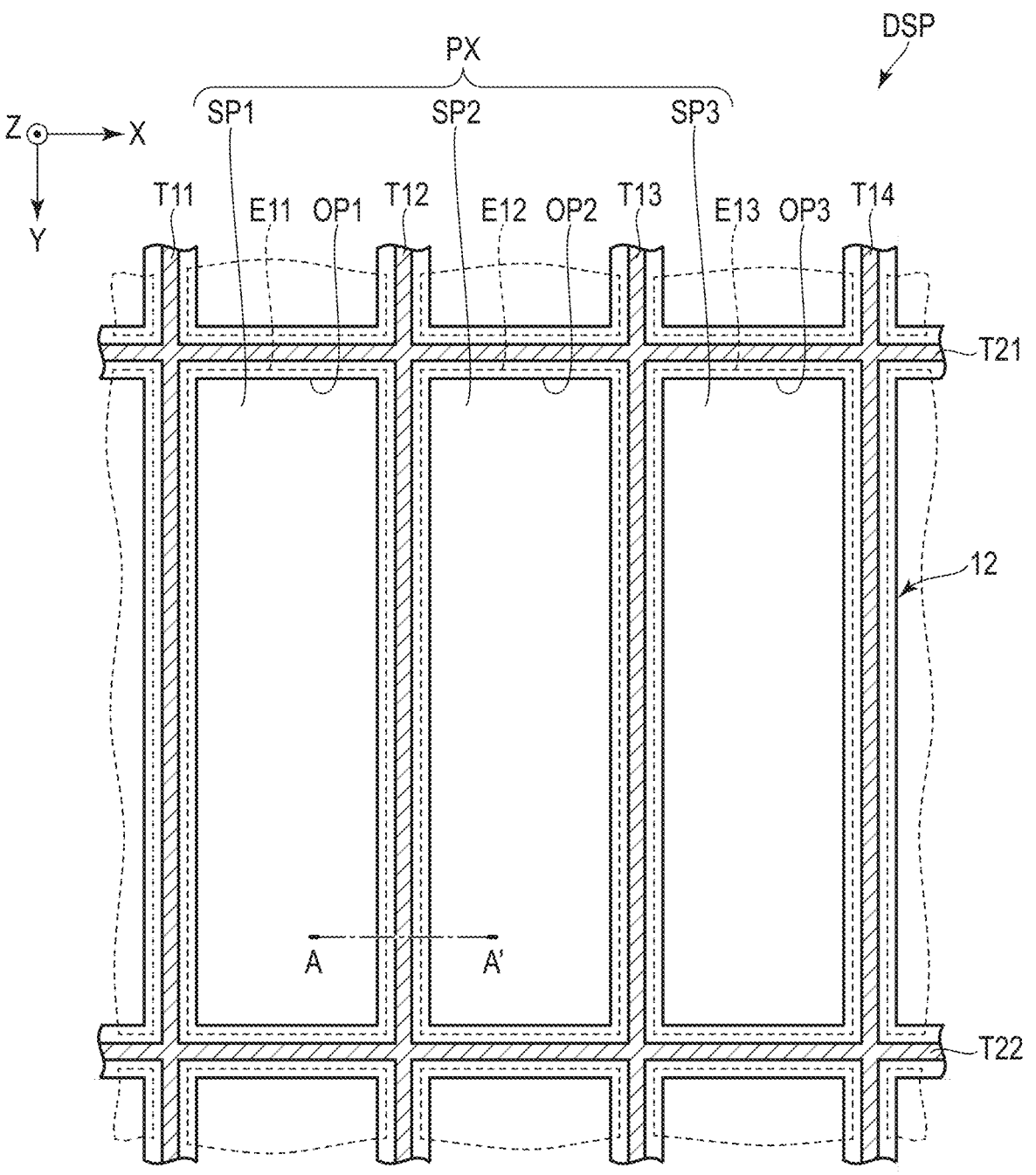
FIG. 2 is a plan view showing a pixel.

In general, according to one embodiment, a display device comprises a base, a first insulating layer disposed on the base, a first lower electrode and a second lower electrode, disposed on the first insulating layer, a second insulating layer disposed on the first insulating layer and including a first aperture which overlaps the first lower electrode, a second aperture which overlaps the second lower electrode, and a first trench located between the first aperture and the second aperture, an organic layer which covers the second insulating layer, the first lower electrode located in the first aperture and the second lower electrode located in the second aperture, and including a light emitting layer and an upper electrode which covers the organic layer, and the first trench comprises a first trench portion including a bottom surface and a first side surface and a second side surface rising from the bottom surface, a second trench portion located above the first trench portion and including a first bottom portion extending from the first side surface to an outer side of the first trench, a second bottom portion extending from the second side surface to an outer side of the first trench, a third side surface rising from the first bottom portion, and a fourth side surface rising from the second bottom portion and a third trench portion located above the second trench portion and including a third bottom portion extending from the third side surface to an outer side of the first trench, a fourth bottom portion extending from the fourth side surface to an outer side of the first trench, a fifth side surface rising from the third bottom portion, and a sixth side surface rising from the fourth bottom portion, a first gap between the first side surface and the second side surface in a lower portion of the first trench portion is greater than a second gap between the first side surface and the second side surface in an upper portion of the first trench portion, a third gap between the third side surface and the fourth side surface in a lower portion of the second trench portion is greater than a fourth gap between the third side surface and the fourth side surface in an upper portion of the second trench portion, a fifth gap between the fifth side surface and the sixth side surface in a lower portion of the third trench portion is greater than a sixth gap between the fifth side surface and the sixth side surface in an upper portion of the third trench portion, the third gap is greater than the first gap and less than the fifth gap, and the fourth gap is greater than the second gap and less than the sixth gap.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

A display device DSP in this embodiment is an organic electroluminescent display device comprising an organic light-emitting diode (OLED) as a display element, and can be installed in televisions, personal computers, mobile terminals, mobile cell phones and the like.

FIG. 1 is a plan view showing a configuration example of the display device DSP of the embodiment.

Some drawings show a first direction X, a second direction Y and a third direction Z which are orthogonal to each other. Note that the first direction X, the second direction Y and the third direction Z may intersect at an angle other than 90 degrees. In the following descriptions, a direction forwarding a tip of an arrow indicating the third direction Z is referred to as "upward" and a direction forwarding oppositely from the tip of the arrow is referred to as "downward". In addition, it is assumed that there is an observation position to observe the display device DSP on a tip side of an arrow in a third direction Z, and viewing from this observation position toward the X-Y plane defined by the first direction X and the second direction Y is referred to as plan view.

The display device DSP comprises an insulating base 10. The base 10 may be glass or a flexible resin film. Further, the display device DSP includes a display area DA in which images are displayed and a non-display area NDA surrounding the display area DA.

The display device DSP comprises, in the display area DA, a plurality of pixels PX arranged in a matrix along the first direction X and the second direction Y. The pixels PX each comprise a plurality of subpixels SP1, SP2 and SP3. For example, the pixels PX each contain a red subpixel SP1, a green subpixel SP2 and a blue subpixel SP3. Note that the pixels PX may additionally contain fourth or more subpixels in addition to the above-described three-color subpixels, of some other color such as white.

A configuration example of one subpixel SP contained in a pixel PX will be briefly described.

That is, the subpixel SP comprises a pixel circuit 1 and a display element 20 driven and controlled by the pixel circuit 1. The pixel circuit 1 comprises a pixel switch 2, a drive transistor 3 and a capacitor 4. The pixel switch 2 and the drive transistor 3 are switching elements constituted by, for example, thin-film transistors.

As to the pixel switch 2, a gate electrode thereof is connected to a respective scanning line GL, a source electrode is connected to a respective signal line SL, and a drain electrode is connected to one of electrodes which constitutes the capacitor 4 and a gate electrode of the drive transistor 3. As to the drive transistor 3, a source electrode is connected to the other electrode of the capacitor 4 and a power line PL, and a drain electrode is connected to an anode of the display element 2. A cathode of the display element 20 is connected to a power feed line FL. Note that the configuration of the pixel circuit 1 is not limited to that of the example shown in the figure.

The display element 20 is an organic light emitting diode (OLED), which is a light-emitting element. For example, the subpixel SP1 comprises a display element which emits light corresponding to red wavelengths, the subpixel SP2 comprises a display element which emits light corresponding to green wavelengths, and the subpixel SP3 comprises a display element which emits light corresponding to blue wavelengths. The configuration of the display element will be described later.

The display device DSP comprises power lines 51 and 52 located in the non-display area NDA, a plurality of peripheral electrodes 6, and pads PD1 and PD2. Further, the non-display region NDA includes a first region N1 and a second region N2, which extend in the second direction Y, and a third region N3 extending in the first direction X. The first region N1, the display region DA and the second region N2 are aligned in this order along the first direction X. In the third region N3, a flexible wiring substrate, not shown in the figure, is mounted.

The power line 51 is located in the first region N1 and the power line 52 is located in the second region N2. The plurality of peripheral electrodes 6 are aligned along the second direction Y in each of the first region N1 and the second region N2. The pads PD1 and PD2 are located in the third region N3.

The power line 51 is electrically connected to the plurality of peripheral electrodes 6 located in the first region N1. The power line 51 is electrically connected to the pad PD1. The power line 52 is electrically connected to the plurality of peripheral electrodes 6 located in the second region N2. The power line 52 is electrically connected to the pad PD2.

FIG. 2 is a plan view of a pixel PX.

FIG. 2 illustrates lower electrodes E11, E12 and E13 and an insulating layer 12 of the display device DSP.

The lower electrode (first lower electrode) E11 is disposed in the subpixel SP1. The lower electrode (second lower electrode) E12 is disposed in the subpixel SP2. The lower electrode E13 is disposed in the subpixel SP3. The lower electrodes E11 to E13 are aligned along the first direction X. The lower electrodes including the lower electrodes E11 to E13 are electrodes arranged for each subpixel or each display element, and may be referred to as pixel electrodes, anodes or the like.

The insulating layer 12 is formed into a grid pattern in plan view. The insulating layer 12 is formed to compartmentalize display elements or subpixels from each other and may be referred to as ribs, partitions or the lie. The insulating layer 12 includes a first aperture OP1 overlapping the lower electrode E11, a second aperture OP2 overlapping the lower electrode E12 and a third aperture OP3 overlapping the lower electrode E13. The insulating layer 12 covers a peripheral portion of each of the lower electrodes E11 to E13, and a central portion of each of the lower electrodes E11 to E13 is exposed from the insulating layer 12 in the first apertures OP1, the second aperture OP2 and the third aperture OP3.

Further, the insulating layer 12 includes a trench T11, a trench T12, a trench T13 and a trench T14 extending in the second direction Y and aligned along the first direction X, and a trench T21 and a trench T22 extending in the first direction X and aligned along the second direction Y. The trench (first trench) T12 is located between the first aperture OP1 and the second aperture OP2. The trench T13 is located between the second aperture OP2 and the third aperture OP3. The trench (second trench) T11 is located on an opposite side to the trench T12 while interposing the first aperture OP1 therebetween. The trench T14 is located on an opposite side to the trench T13 while interposing the third aperture OP3 therebetween. The trench (third trench) T21 is connected to the trenches T11 to T14. The trench (fourth trench) T22 as well is connected to the trenches T11 to T14. The trench T21 is located on an opposite side to the trench T22 while interposing the first aperture OP1, the second aperture OP2 and third aperture OP3 therebetween.

The trenches are arranged so as not to overlap the adjacent lower electrodes in plan view. That is, the lower electrode E11 is located between the trench T11 and the trench T12, the lower electrode E12 is located between the trench T12 and the trench T13, and the lower electrode E13 is located between the trench T13 and the trench T14. Further, the lower electrodes E11 to E13 are located between the trench T21 and the trench T22.

Here, the outline of the subpixels corresponds to the outline of the lower electrodes, for example. That is, the subpixel SP1, the subpixel SP2 and the subpixel SP3 which constitute one pixel PX, are each formed into substantially a rectangular shape extending in the second direction Y and are aligned along the first direction X. The emission colors of those of the subpixels aligned in the first direction X, which are adjacent to each other are different from each other. Note that the areas of the subpixel SP1, the subpixel SP2 and the subpixel SP3 may be the same as each other, or may be different from each other as described below. The outline of the subpixels may be defined by the outline of the light emitting regions of the display elements.

FIG. 3 shows a cross-sectional view of the display device DSP taken along line A-A' shown in FIG. 2.

The display device DSP comprises a base 10, switching elements SW1 and SW2, an insulating layer 11, lower electrodes E11 and E12, an insulating layer 12, an organic layer OR and an upper electrode E2. Further, the display element 20A is constituted by the lower electrode E11, a first portion OR1 of the organic layer OR and the upper electrode E2. The display element 20B is constituted by the lower electrode E12, a second portion OR2 of the organic layer OR and the upper electrode E2.

The switching elements SW1 and SW2 are disposed on the base 10. The switching elements SW1 and SW2 correspond, for example, to the drive transistor 3 shown in FIG. 1. The insulating layer (first insulating layer) 11 is disposed on the base 10 and covers the switching elements SW1 and SW2. The insulating layer 11 corresponds to the underlying layer of the display elements 20A and 20B, and is, for example, an organic insulating layer. Note that the pixel switch 2 of the pixel circuit 1, and the like shown in FIG. 1 are disposed on the base 10 and covered by the insulating layer 11, but illustration thereof is omitted here.

The lower electrodes E11 and E12 are disposed on the insulating layer 11. The lower electrode E11 is electrically connected to the switching element SW1 via a contact hole CH1 formed in the insulating layer 11. The lower electrode E12 is electrically connected to the switching element SW2 via a contact hole CH2 formed in the insulating layer 11.

The lower electrodes E11 and E12 are transparent electrodes formed of, for example, a transparent conductive material such as indium tin oxide (ITO) or indium zinc oxide (IZO). Note that the lower electrodes E11 and E12 may be metal electrodes formed from a metal material such as silver or aluminum. Further, the lower electrodes E11 and E12 may be a stacked body of a transparent electrode and a metal electrode. For example, the lower electrodes E11 and E12 may be configured as a stacked body in which a transparent electrode, a metal electrode and a transparent electrode are stacked in this order, or as a stacked body of three or more layers.

The insulating layer (second insulating layer) 12 is disposed on the insulating layer 11 and covers the peripheral portion of each of the lower electrodes E11 and E12. The insulating layer 12 is, for example, an organic insulating layer. The insulating layer 12 includes the first aperture OP1, the second aperture OP2 and the trench T12 described above, and a first surface SF1 and a second surface SF2. The first aperture OP1 penetrates the insulating layer 12 to the lower electrode E11. The second aperture OP2 penetrates the insulating layer 12 to the lower electrode E12. The first surface SF1 is located between the trench T12 and the first aperture OP1. The second surface SF2 is located between the trench T12 and the second aperture OP2. Further, the insulating layer 12 has a thickness TH. The thickness TH corresponds to the distance between the highest position of the insulating layer 12 and the insulating layer 11 in the illustrated example, and is, for example, 1.5 to 2.0 μm.

The trench T12 includes a first trench portion TP1, a second trench portion TP2 located above the first trench portion TP1, and a third trench portion TP3 located above the second trench portion TP2.

The first trench portion TP1 includes a bottom surface BS, a first side surface S1 and a second side surface S2 rising from the bottom surface BS. The bottom surface BS is, for example, a plane that is substantially parallel to the X-Y plane. The first side surface S1 and the second side surface S2 are spaced apart from and oppose each other along the first direction X.

The second trench portion TP2 includes a first bottom portion B1 extending from the first side surface S1 towards an outer side of the trench T12, a second bottom portion B2 extending from the second side surface S2 towards an outer side of the trench T12, a third side surface S3 rising from the first bottom portion B1 and a fourth side surface S4 rising from the second bottom portion B2. The first bottom portion B1 and the second bottom portion B2 are, for example, substantially parallel to the bottom surface BS. The third side surface S3 and the fourth side surface S4 are spaced apart and oppose each other in the first direction X.

The third trench portion TP3 includes a third bottom portion B3 extending from the third side surface S3 towards an outer side of the trench T12, a fourth bottom portion B4 extending from the fourth side surface S4 towards an outer side of the trench T12, a fifth side surface S5 rising from the third bottom portion B3 and a sixth side surface S6 rising from the fourth bottom portion B4. The third bottom portion B3 and the fourth bottom portion B4 are, for example, surfaces substantially parallel to the bottom surface BS. The fifth side surface S5 and the sixth side surface S6 are spaced apart from and oppose each other along the first direction X.

The fifth side surface S5 is connected to the first side surface SF1. The sixth side surface S6 is connected to the second side surface SF2. The trench T12 corresponds to a space enclosed by the first side surface S1, the second side surface S2, the third side surface S3, the fourth side surface S4, the fifth side surface S5, the sixth side surface S6, the bottom surface BS, the first bottom portion B1, the second bottom portion B2, the third bottom portion B3 and the fourth bottom portion B4.

The first trench portion TP1 includes a first gap GP1 between the first side surface S1 and the second side surface S2 in its lower portion and a second gap GP2 between the first side surface S1 and the second side surface S2 in its upper portion. The first gap GP1 is larger than the second gap GP2. In other words, the first trench portion TP1 is formed so that the width along the first direction X decreases from the lower portion towards the upper portion. In other words, the first side surface S1 is inclined with respect to the normal direction of the bottom surface BS so as to overlap the bottom surface BS. Similarly, the second side surface S2 is inclined with respect to the normal direction of the bottom surface BS so as to overlap the bottom surface BS.

The second trench portion TP2 includes a third gap GP3 between the third side surface S3 and the fourth side surface S4 in its lower portion and a fourth gap GP4 between the third side surface S3 and the fourth side surface S4 in its upper portion. The third gap GP3 is larger than the fourth gap GP4. In other words, the second trench portion TP2 is formed so that the width along the first direction X decreases from the lower portion towards the upper portion. In other words, the third side surface S3 is inclined with respect to the normal direction of the first bottom portion B1 so as to overlap the first bottom portion B1. Similarly, the fourth side surface S4 is inclined with respect to the normal direction of the second bottom portion B2 so as to overlap the second bottom portion B2.

The third trench portion TP3 includes a fifth gap GP5 between the fifth side surface S5 and the sixth side surface S6 in its lower portion and a sixth gap GP6 between the fifth side surface S5 and the sixth side surface S6 in its upper portion. The fifth gap GP5 is larger than the sixth gap GP6. In other words, the third trench portion TP3 is formed so that the width along the first direction X decreases from the lower portion towards the upper portion. In other words, the fifth side surface S5 is inclined with respect to the normal direction of the third bottom portion B3 so as to overlap the third bottom portion B3. Similarly, the sixth side surface S6 is inclined with respect to the normal direction of the fourth bottom portion B4 so as to overlap the fourth bottom portion B4.

The third gap GP3 is larger than the first gap GP1 and smaller than the fifth gap GP5. The fourth gap GP4 is larger than the second gap GP2 and smaller than the sixth gap GP6.

The organic layer OR covers the insulating layer 12, the lower electrode E11 located in the first aperture OP1, and the lower electrode E12 located in the second aperture OP2. The organic layer OR includes a first portion OR1, a second portion OR2 and a third portion OR3. The first portion OR1 covers the lower electrode E11 located in the first aperture OP1, and the first surface SF1. The second portion OR2 covers the lower electrode E12 located in the second aperture OP2, and the second surface SF2. A part of the first portion OR1 and a part of the second portion OR2 are located in the trench T12 as well. The third portion OR3 is located at the bottom surface BS of the trench T12. The third portion OR3 is spaced apart from the first portion OR1 and the second portion OR2. The organic layer OR includes a light emitting layer EL as will be described later, and the first portion OR1, the second portion OR2 and the third portion OR3 include the color light emitting layers EL of the same color. In addition to the light-emitting layer EL, the organic layer OR includes at least one of a hole injection layer, a hole transport layer, an electron injection layer and an electron transport layer.

The upper electrode E2 covers the organic layer OR. That is, the upper electrode E2 covers each of the first portion OR1, the second portion OR2, and the third portion OR3. The upper electrode E2 covers the third portion OR3 and is in contact with the bottom surface BS, inside the trench T12. Further, the upper electrode E2 is in contact with the first side surface S1 and the second side surface S2 inside the trench T12. The upper electrode E2 is a transparent electrode formed of, for example, a transparent conductive material such as ITO or IZO. The upper electrode E2 is electrically connected to the feed line FL located in the display area DA shown in FIG. 1. The upper electrode E2 is an electrode commonly arranged for a plurality of subpixels or a plurality of display elements, and may be referred to as a common electrode, counter electrode, cathode or the like. Note that the upper electrode E2 may be covered by a transparent protective layer (including at least one of an inorganic insulating layer and an organic insulating layer) in some cases.

In the display device 20A, the first portion OR1 is located between the lower electrode E11 and the upper electrode E2 to form a light emitting region. In display element 20B, the second portion OR2 is located between the lower electrode E12 and the upper electrode E2 to form a light-emitting region. Note that the third portion OR3 is located between the insulating layer 12 and the upper electrode E2 and is completely separated from the first portion OR1 and the second portion OR2, and therefore it does not emit light. Further, of the first portion OR1, the region which covers the first surface SF1 and the region located in the trench T12 are located between the insulating layer 12 and the upper electrode E2, and therefore they do not substantially emit light. Similarly, of the second portion OR2, the region which covers the second surface SF2 and the region located in the trench T12 are located between the insulating layer 12 and the upper electrode E2, and therefore they do not substantially emit light.

FIG. 4 is a cross-sectional view showing a detailed configuration of the organic layer OR.

The organic layer OR comprises a lower layer L1, a middle layer L2 and an upper layer L3, stacked one on another. The lower layer L1 comprises a first lower layer portion L11 which covers the first surface SF1, a second lower layer portion L12 located in the third bottom portion B3, a third lower layer portion L13 located in the first bottom portion B1, a fourth lower layer portion L14 located in the bottom portion BS, a fifth lower layer portion L15 located in the second bottom portion B2, a sixth lower layer portion L16 located in the fourth bottom portion B4, and a seventh lower layer portion L17 which covers the second surface SF2. The first lower layer portion L11, the second lower layer portion L12, the third lower layer portion L13, the fourth lower layer portion L14, the fifth lower layer portion L15, the sixth lower layer portion L16 and the seventh lower layer portion L17 are separated from each other.

The middle layer L2 comprises a first middle layer portion L21 which continuously covers the first lower layer portion L11 and the second lower layer portion L12, a second middle layer portion L22 which overlaps the third lower layer portion L13, a third middle layer portion L23 which overlaps the fourth lower layer portion L14, a fourth middle layer portion L24 which overlaps the fifth lower layer portion L15, and a fifth middle layer portion L25 which continuously covers the sixth lower layer portion L16 and the seventh lower layer portion L17. The first middle layer portion L21, the second middle layer portion L22, the third middle layer portion L23, the fourth middle layer portion L24 and the fifth middle layer portion L25 are separated from each other.

The upper layer L3 comprises a first upper layer portion L31 which continuously covers the first middle layer portion L21 and the second middle layer portion L22, a second upper layer portion L32 which overlaps the third middle layer portion L23, and a third upper layer portion L33 which continuously covers the fourth middle layer portion L24 and the fifth middle layer portion L25. The first upper layer portion L31, the second upper layer portion L32 and the third upper layer portion L33 are separated from each other.

The first lower layer portion L11 includes a first end portion EG1 located on a trench T12 side. The first end portion EG1 is covered by the first middle layer portion L21. The first middle layer portion L21 includes a second end portion EG2 located on the trench T12 side. The second end portion EG2 is covered by the first upper layer portion L31. The seventh lower layer portion L17 includes a third end portion EG3 located on the trench T12 side. The third end portion EG3 is covered by the fifth middle layer portion L25. The fifth middle layer portion L25 includes a fourth end portion EG4 located on the trench T12 side. The fourth end portion EG4 is covered by the third upper layer portion L33.

The first portion OR1 described above includes the first lower layer portion L11, the second lower layer portion L12, the third lower layer portion L13, the first middle layer portion L21, the second middle layer portion L22, and the first upper layer portion L31. The second portion OR2 described above includes the fifth lower portion L15, the sixth lower portion L16, the seventh lower portion L17, the fourth middle portion L24, the fifth middle portion L25 and the third upper portion L33. The third portion OR3 described above includes the fourth lower portion L14, the third middle portion L23 and the second upper portion L32.

As shown in the figure, the gap GP is formed between the fifth side surface S5 and the second lower layer portion L12. The gap GP is formed between the third side surface S3 and the third lower layer portion L13 and the second middle-layer portion L22. The gap GP is formed between the fourth side surface S4 and the fifth lower layer portion L15 and the fourth middle-layer portion L24. The gap GP is formed between the sixth side surface S6 and the sixth lower layer portion L16. These gaps GP may not necessarily be formed, but may be filled by the organic layer OR.

The upper electrode E2 is in contact with the first upper layer portion L31, the second upper layer portion L32, the third upper layer portion L33, the second middle layer portion L22, the third middle layer portion L23, the fourth middle layer portion L24, the third lower layer portion L13, the fourth lower layer portion L14 and the fifth lower layer portion L15 in the trench T12.

The first trench portion TP1 has a first depth D1, the second trench portion TP2 has a second depth D2, and the third trench portion TP3 has a third depth D3. The second depth D2 is less than the first depth D1 and greater than the third depth D3. That is, the lower the trench portion is located, the deeper it is formed. The trench T12 has a fourth depth D4. The fourth depth D4 corresponds to the sum of the first depth D1, the second depth D2 and the third depth D3. The fourth depth D4 is, for example, 0.5 to 1.0 μm.

Next, the film formation process for the organic layer OR will be described.

The organic layer OR described above is formed, for example, by the vacuum deposition method. The way in which the organic material for forming the organic layer OR is released from the evaporation source is indicated in the figure as single dotted lines. After forming the insulating layer 12 including the first aperture OP1, the second aperture OP2 and the trench T12, the organic material for forming the organic layer OR is deposited.

First, the organic material for forming the lower layer L1 is deposited. Since the fifth side surface S5 is inclined, the lower layer L1 is not substantially formed on the fifth side surface S5. As a result, the lower layer L1 is formed so as to be separated into as the first lower layer portion L11 and the second lower layer portion L12. Similarly, since the third side surface S3 is inclined, the lower layer L1 is not substantially formed on the third side surface S3. As a result, the lower layer L1 is formed so as to be separated into as the second lower layer portion L12 and the third lower layer portion L13. Similarly, since the first side surface S1 is inclined, the lower layer L1 is not substantially formed on the first side surface S1. As a result, the lower layer L1 is formed so as to be separated into as the third lower layer portion L13 and the fourth lower layer portion L14.

Since the second side surface S2 is inclined, the lower layer L1 is not substantially formed on the second side surface S2. As a result, the lower layer L1 is formed so as to be separated into as the fourth lower layer portion L14 and the fifth lower layer portion L15. Similarly, since the fourth side surface S4 is inclined, the lower layer L1 is not substantially formed on the fourth side surface S4. As a result, the lower layer L1 is formed so as to be separated into as the fifth lower layer portion L15 and the sixth lower layer portion L16. Similarly, since the sixth side surface S6 is inclined, the lower layer L1 is not substantially formed on the sixth side surface S6. As a result, the lower layer L1 is formed so as to be separated into as the sixth lower layer portion L16 and the seventh lower layer portion L17.

In other words, the lower layer L1 is separated by the first side surface S1, the second side surface S2, the third side surface S3, the fourth side surface S4, the fifth side surface S5 and the sixth side surface S6 into the first lower layer portion L11, the second lower layer portion L12, the third lower layer portion L13, the fourth lower layer portion L14, the fifth lower layer portion L15, the sixth lower layer portion L16 and the seventh lower layer portion L17.

Next, an organic material for forming the middle layer L2 is deposited. Since the second lower layer portion L12 is located in the third bottom portion B3, the middle layer L2 is not separated by the fifth side surface S5. The middle layer L2 is separated by the third side surface S3 into the first middle layer portion L21 and the second middle layer portion L22 because the second trench portion TP2 has a sufficient depth. The middle layer L2 is separated by the first side surface S1 into the second middle layer portion L22 and the third middle layer portion L23 because the first trench portion TP1 has a sufficient depth. The middle layer L2 is separated by the second side surface S2 into the third middle layer portion L23 and the fourth middle layer portion L24 because the first trench portion TP1 has a sufficient depth. The middle layer L2 is separated by the fourth side surface S4 into the fourth middle portion L24 and the fifth middle portion L25 because the second trench portion TP2 has a sufficient depth. The middle layer L2 is not separated by the sixth side surface S6 because the sixth lower layer portion L16 is located in the fourth bottom portion B4.

Next, an organic material for forming the upper layer L3 is deposited. The upper layer L3 is not separated by the fifth side surface S5 because the second lower layer portion L12 and the first middle layer portion L21 are located to overlap the third bottom portion B3. The upper layer L3 is not separated by the third side surface S3 because the third lower portion L13 and the second middle portion L22 are located to overlap the first bottom portion B1. The upper layer L3 is separated by the first side surface S1 into as the first upper layer portion L31 and the second upper layer portion L32 because the first trench portion TP1 has a sufficient depth. The upper layer L3 is separated by the second side surface S2 into as the second upper layer portion L32 and the third upper layer portion L33 because the first trench portion TP1 has a sufficient depth. The upper layer L3 is not separated by the fourth side surface S4 because the fifth lower layer portion L15 and the fourth middle layer portion L24 are located to overlap the second bottom portion B2. The upper layer L3 is not separated by the sixth side surface S6 because the sixth lower portion L16 and the fifth middle portion L25 are located to overlap the fourth bottom portion B4.

Note that since the upper electrode E2 is formed by sputtering, it is continuously formed on the organic layer OR, the bottom surface BS, the first side surface S1 and the second side surface S2.

Next, the advantageous effects that can be obtained by this embodiment will be explained.

It is desirable that the bottom layer L1, which is located at the lowermost layer of the organic layer OR, should be in contact with the lower electrodes E11 and E12, and the upper layer L3, which is the uppermost layer, should be in contact with the upper electrode E2. However, for example, when the organic layer OR is provided to be separated for each subpixel, the lower layer L1 and the middle layer L2 may undesirably be exposed from the upper layer L3 at the end portion of the organic layer OR and come into contact with the upper electrode E2. As a result, a current leakage from the lower layer L1 or the middle layer L2 to the upper electrode E2 occurs, thus making it difficult in some cases to obtain a desired brightness and chromaticity with respect to the voltage applied.

According to this embodiment, the trench T12 includes a trench portion that is formed deeper as the location is lower, and the first side surface S1, the second side surface S2, the third side surface S3, the fourth side surface S4, the fifth side surface S5 and the sixth side surface S6 are inclined. With this structure, among the first lower layer portion L11, the first middle layer portion L21 and the first upper layer portion L31 that contribute to the display of the display element 20A, the layers located on the upper side are more separated on an outer side of the subpixel SP1. Therefore, the first lower layer portion L11 and the first middle layer portion L21 are covered by the first upper layer portion L31, thereby making it possible to suppress contacting with the upper electrode E2. Similarly, among the seventh lower layer portion L17, the fifth middle layer portion L25 and the third upper layer portion L33 that contribute to the display of the display element 20B, the layers located on the upper side are more separated on an outer side of the subpixel SP2. Therefore, the seventh lower layer portion L17 and the fifth middle layer portion L25 are covered by the third upper layer portion L33, thereby making it possible to suppress contacting with the upper electrode E2.

Since the third lower layer portion L13 and the second middle layer portion L22 in contact with the upper electrode E2 are separated from the first lower layer portion L11 and the first middle layer portion L21 that contribute to the display, current leakage from the third lower layer portion L13 and the second middle layer portion L22 to the upper electrode E2 does not occurs. Further, since the fifth lower layer portion L15 and the fourth middle layer portion L24, which are in contact with the upper electrode E2, are separated from the seventh lower layer portion L17 and the fifth middle layer portion L25, which contribute to the display, current leakage from the fifth lower layer portion L15 and the fourth middle layer portion L24 to the upper electrode E2 does not occur.

Therefore, current leakage from the lower layer L1 and the middle layer L2 to the upper electrode E2 is suppressed, thereby making it possible to suppress degradation in performance of the display device.

Note that the depth of each trench portion is adjusted according to the film thickness of each layer which constitutes the organic layer OR. Further, in the example illustrated, the trench T12 includes three trench portions, but it may as well include four or more trench portions. The number of trench portions may be greater than the number of layers which constitute the organic layer OR. Further, the organic layer OR may be constituted by four or more layers, for example. In such a case as well, the uppermost layer among the layers constituting the organic layer OR is separated on an outer side with respect to the other layers. Further, in the example shown in FIG. 4, the first side surface S1, the second side surface S2, the third side surface S3, the fourth side surface S4, the fifth side surface S5, the sixth side surface S6 and the bottom surface BS are flat, but they may as well be curved.

Moreover, according to this embodiment, the organic layer OR can be formed to be separated into the first portion OR1 located in the subpixel SP1 and the second portion OR2 located in the subpixel SP2 in the trench T12. That is, by full-surface deposition without using a mask, the organic layer ORs can be formed to be separated for each subpixel. With this configuration, it is possible to suppress crosstalk between adjacent subpixels. Further, since separate components for separating the organic layer ORs are not required, manufacturing costs can be reduced.

As described above, the organic layer OR includes a light-emitting layer EL, and for example, the light-emitting layer EL is any one of the lower layer L1, the middle layer L2 and the upper layer L3. Here, let us assume, for example, that the lower layer L1 and the upper layer L3 are functional layers, and the middle layer L2 is the light-emitting layer EL. The lower layer L1 and the upper layer L3 are, for example, a hole injection layer, a hole transport layer, a hole blocking layer, an electron injection layer, an electron transport layer, and an electron blocking layer, but may as well be other functional layers. Each of the lower layer L1 and the upper layer L3 is not limited to a single layer, but may as well be a stacked body of a plurality of functional layers. Further, at least one of the lower layer L1 and the upper layer L3 may be omitted.

For example, when the lower electrodes E11 and E12 correspond to anodes, the lower layer L1 located between the light emitting layer EL and the lower electrodes E11 and E12 includes at least one of a hole injection layer and a hole transport layer, and the upper layer L3 located between the light emitting layer EL and the upper electrode E2 includes at least one of an electron transport layer and an electron injection layer.

Note that when the potential of the lower electrodes E11 and E12 is relatively higher than the potential of the upper electrode E2, the lower electrodes E11 and E12 correspond to anodes and the upper electrode E2 corresponds to a cathode. When the potential of the upper electrode E2 is relatively higher than the potential of the lower electrodes E11 and E12, the upper electrode E2 corresponds to the anode and the lower electrodes E11 and E12 correspond to the cathodes.

Moreover, for example, in all of the subpixels SP in the display area DA, organic layers OR including the light-emitting layers EL of the same color are disposed. When the emission color of each display element is white, a multicolor display can be realized by arranging color filters opposing the display elements. Further, when the emission color of each display element is ultraviolet light, a multicolor display can be realized by arranging a photo-conversion layer opposing the display elements.

Figure 5:
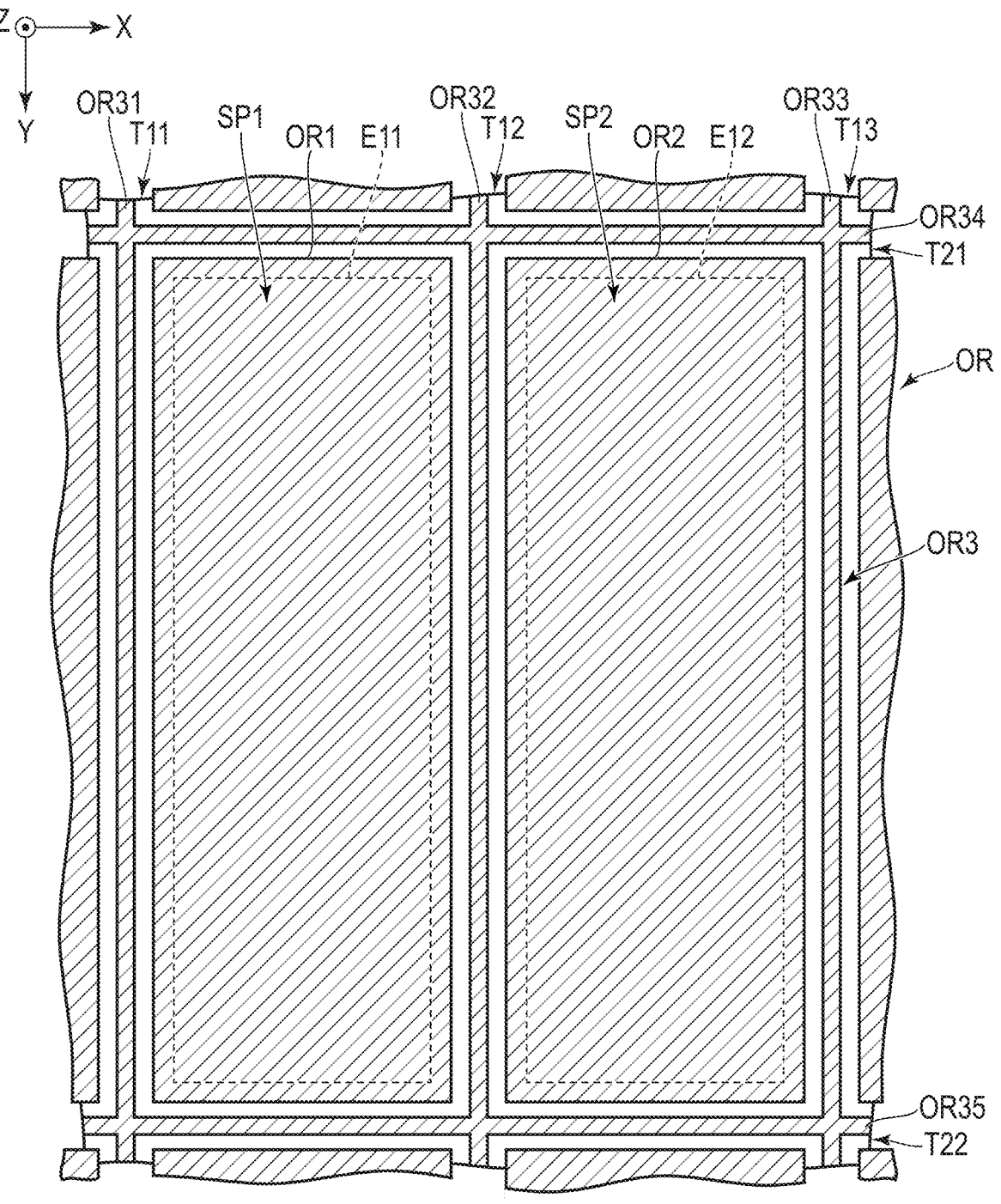
FIG. 5 is a plan view of the organic layer.

FIG. 5 is a plan view of the organic layer OR. In FIG. 5, the region where the organic layer OR is placed is indicated by shaded lines.

The first portion OR1 is disposed in the subpixel SP1. The second portion OR2 is disposed in the subpixel SP2. The first portion OR1 and the second portion OR2 are aligned along the first direction X.

The third portion OR3 is formed into a grid shape in plan view. The third portion OR3 includes portions OR31, OR32 and OR33 extending in the second direction Y and aligned along the first direction X, and portions OR34 and OR35 extending in the first direction X and aligned along the second direction Y. The portion OR32 is located between the first portion OR1 and the second portion OR2. The portion OR31 is located on an opposite side to the portion OR32 while interposing the first portion OR1 therebetween. The portion OR33 is located on an opposite side to the portion OR32 while interposing the second portion OR2 therebetween. The portion OR34 is connected to the portions OR31 to OR33. The portion OR35 is connected to the portions OR31 to OR33. The portion OR34 is located on an opposite side to the portion OR35 while interposing the first portion OR1 and the second portion OR2.

The portions OR31 to OR33 are located in the trenches T11 to T13, respectively. Further, the portions OR34 and OR35 are located in the trenches T21 and T22, respectively.

Note that the outline of the first portion OR1 is larger than the outline of the lower electrode E11 in plan view. The outline of the second portion OR2 is formed larger than the outline of the lower electrode E12 in plan view.

Figure 6:
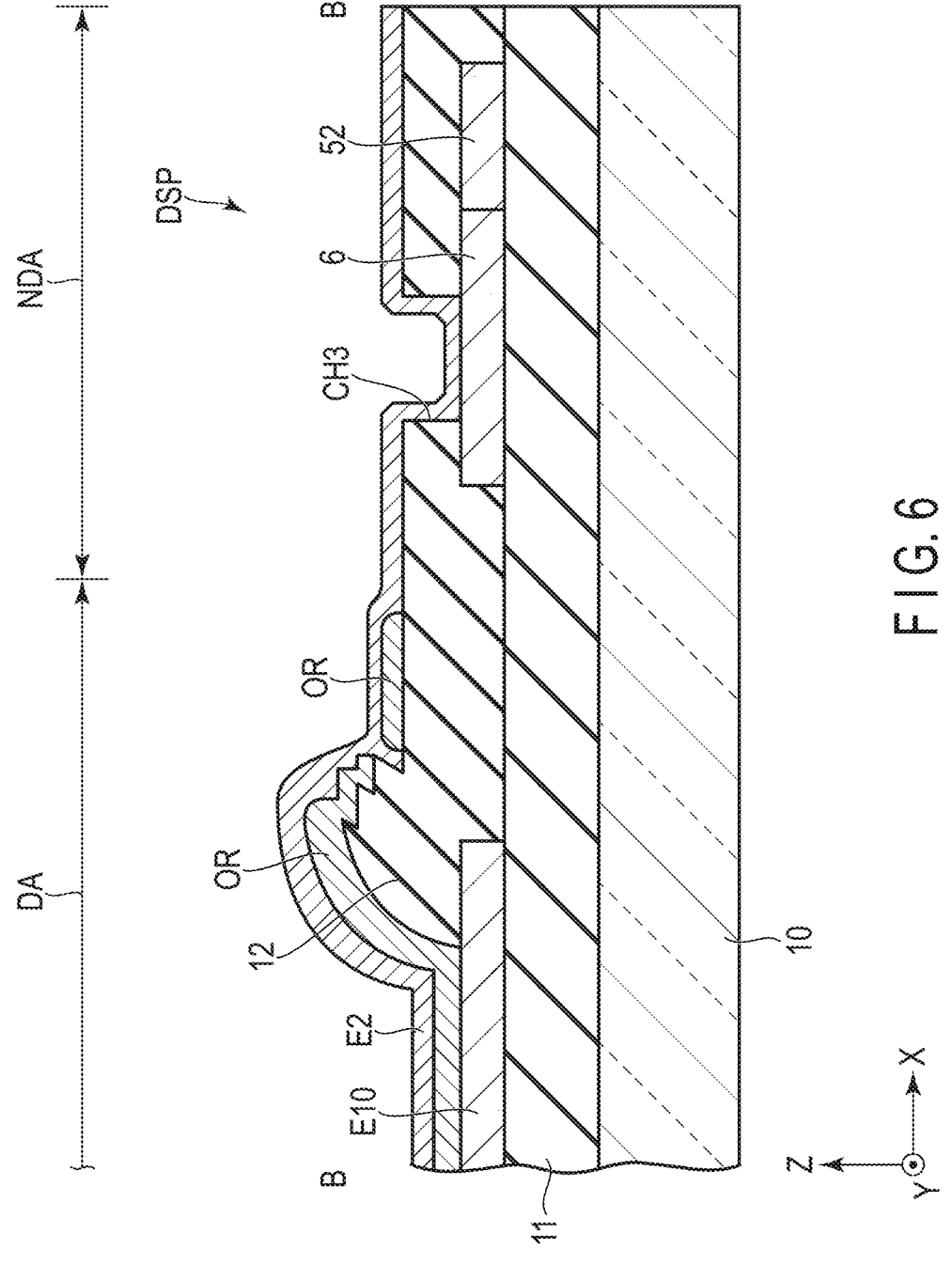
FIG. 6 is a cross-sectional view of the display device taken along line B-B' shown in FIG. 1.

FIG. 6 is a cross-sectional view of the display device DSP taken along line B-B' shown in FIG. 1.

The peripheral electrode 6 and the power line 52 are located on the insulating layer 11. The insulating layer 12 covers the peripheral electrode 6 and the power line 52. The organic layer OR is not formed in the non-display area NDA. The upper electrode E2 covers the insulating layer 12 in the non-display area NDA and is connected to the peripheral electrode 6 via the contact hole CH3 formed in the insulating layer 12. In the example illustrated, the peripheral electrode 6 and the power line 52 are located in the same layer as that of the lower electrode E10, but they may as well be located in different layers from that of the lower electrode E10, respectively.

FIG. 7 is a cross-sectional view of the first modified example of this embodiment. The configuration shown in FIG. 7 is different from that of FIG. 3 in that the trench T12 penetrates the insulating layer 12 to the insulating layer 11.

In the example shown in the figure, the bottom surface BS corresponds to the upper surface of the insulating layer 11. Therefore, the third portion OR3 and the upper electrode E2 are in contact with the insulating layer 11 in the trench T12.

In such a first modified example as described above, advantageous effects similar to those described above can be obtained.

Figure 8:
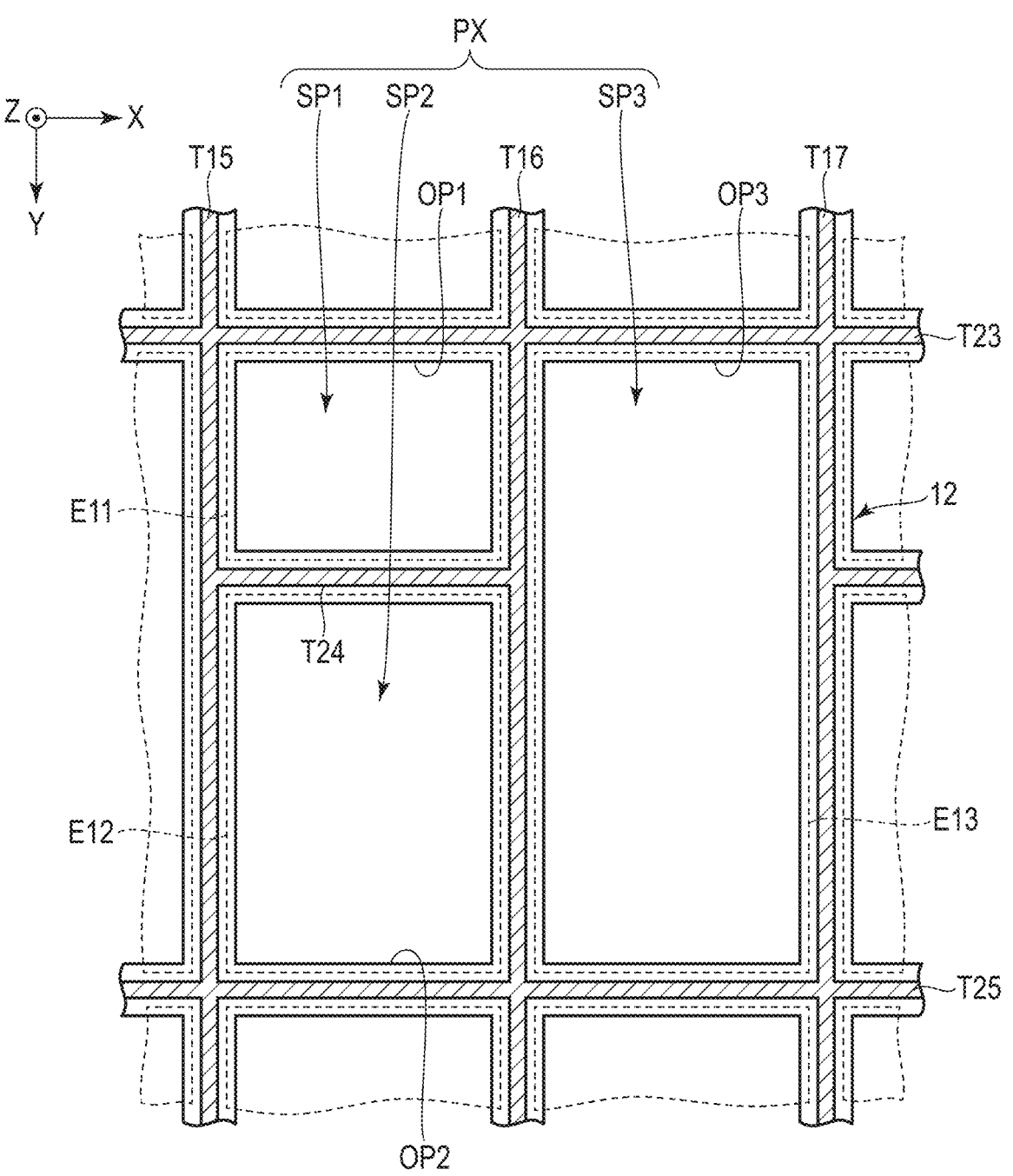
FIG. 8 is a plan view showing a second modified example of this embodiment.

FIG. 8 is a plan view of the second modified example of this embodiment. The configuration shown in FIG. 8 is different from that of FIG. 2 in the layout of the subpixel SP1, the subpixel SP2 and the subpixel SP3.

The lower electrodes E11 and E12 are aligned along the second direction Y. The lower electrode E13 is aligned along the lower electrodes E11 and E12 in the first direction X.

The insulating layer 12 includes trenches T15, T16 and T17 extending in the second direction Y and aligned along the first direction X, and trenches T23, T24 and T25 extending in the first direction X and aligned along the second direction Y. The trench T16 is located between the first opening OP1 and the second opening OP2, and the third aperture OP3. The trench T15 is located on an opposite side to the trench T16 while interposing the first aperture OP1 and the second aperture OP2. The trench T17 is located on an opposite side to the trench T16 while interposing the third aperture OP3 therebetween. The trench T23 is connected to the trenches T15 to T17. The trench T24 is connected to the trenches T15 and T16. The trench T25 is connected to the trenches T15 to T17. The trench T23 is located on an opposite side to the trench T25 while interposing the first aperture OP1, the second aperture OP2 and the third aperture OP3 therebetween. The trench T24 is located between the first aperture OP1 and the second aperture OP2.

Each trench does not overlap adjacent lower electrodes in plan view. In the first direction X, the lower electrodes E11 and E12 are located between the trenches T15 and T16, and the lower electrode E13 is located between the trenches T16 and T17. Further, in the second direction Y, the lower electrode E11 is located between the trenches T23 and T24, the lower electrode E12 is located between the trenches T24 and T25, and the lower electrode E13 is located between the trenches T23 and T25.

The sub-pixel SP1 and the subpixel SP2 are aligned along the second direction Y, the subpixel SP1 and the subpixel SP3 are aligned along the first direction X, and the subpixel SP2 and the subpixel SP3 are aligned along the first direction X. The subpixel SP1 is formed into a substantially rectangular shape extending along the first direction X, and the subpixel SP2 and the subpixel SP3 are formed into a substantially rectangular shape extending along the second direction Y. The emission colors of the subpixels SP1 to SP3 are different from each other. Further, the areas of the subpixels SP1 to SP3 are different from each other. The area of the subpixel SP2 is larger than that of the subpixel SP1, and the area of the subpixel SP3 is larger than that of the subpixel SP2. Note that the area of the subpixel SP1 may be the same as that of the subpixel SP2.

In such a second modified example as described above, advantageous effects similar to those described above can be obtained.

Figure 9:
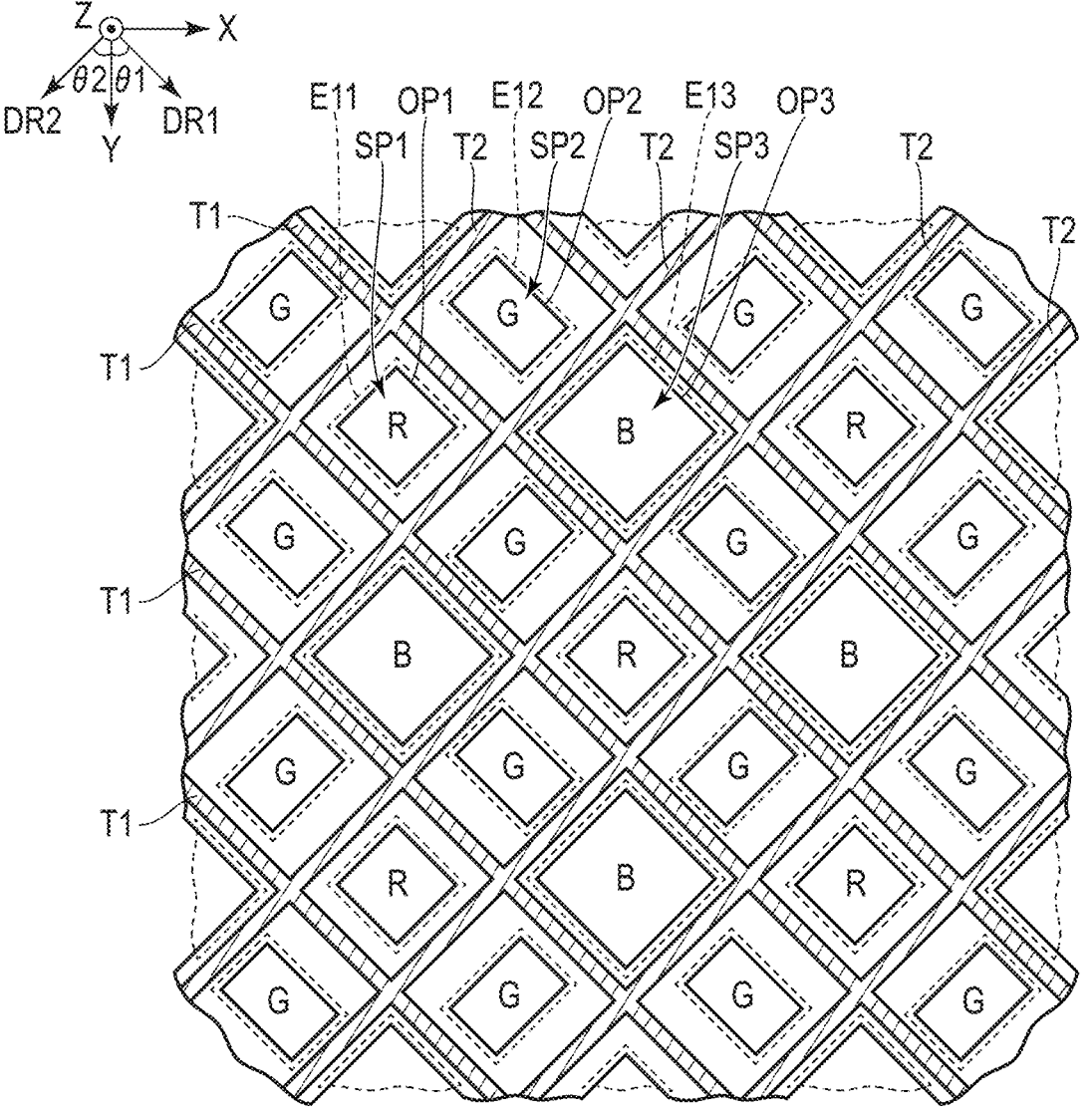
FIG. 9 is a plan view showing a third modified example of this embodiment.

FIG. 9 is a plan view of the third modified example of this embodiment. The configuration shown in FIG. 9 is different from that of FIG. 2 in the layout of the subpixel SP1, the subpixel SP2 and the subpixel SP3. The direction DR1 shown in FIG. 9 is inclined at an angle $\theta1$ counterclockwise with respect to the second direction Y, and the direction DR2 shown in FIG. 9 is inclined at an angle $\theta2$ clockwise with respect to the second direction Y.

The insulating layer 12 includes a plurality of trenches T1 extending in the direction DR1 and aligned along the direction DR2, and a plurality of trenches T2 extending in the direction DR2 and aligned along the direction DR1. The plurality of lower electrodes E11 and the plurality of first openings OP1 are respectively located in the plurality of red subpixels SP1. The plurality of lower electrodes E12 and the plurality of second apertures OP2 are respectively located in the plurality of green subpixels SP2. The plurality of lower electrodes E13 and the plurality of third apertures OP3 are respectively located in the plurality of blue subpixels SP3.

Each of the plurality of lower electrodes E11 and E12, which are alternately aligned along the direction DR1, is located between each respective adjacent pair of trenches T1. Further, each of the plurality of lower electrodes E12 and E13, which as well are aligned alternately along the direction DR1, is located between each respective adjacent pair of trenches T1. Each of the plurality of lower electrodes E11 and E12, which are aligned alternately along the direction DR2, is located between each respective adjacent pair of trenches T2. Each of the plurality of lower electrodes E12 and E13, which as well are aligned alternately along the direction DR2, is located between each respective adjacent pair of trenches T2. Each of the trenches T1 and T2 does not overlap adjacent lower electrodes in plan view.

The subpixels SP1 and SP3 are formed into a substantially square shape, some of the subpixels SP2 are formed into a substantially rectangular shape extending in the direction DR1, and other subpixels SP2 are formed into a substantially rectangular shape extending in the direction DR2. Further, the areas of the subpixels SP1 to SP3 are different from each other. The area of the subpixel SP3 is larger than that of the subpixel SP1, and the area of the subpixel SP1 is larger than that of the subpixel SP2.

In such a third modified example as described above, advantageous effects similar to those described above can be obtained.

As described above, according to this embodiment, it is possible to obtain a display device which can suppress degradation in performance of the display element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:

a base;

a first insulating layer disposed on the base;

a first lower electrode and a second lower electrode, disposed on the first insulating layer;

a second insulating layer disposed on the first insulating layer and including a first aperture which overlaps the first lower electrode, a second aperture which overlaps the second lower electrode, and a first trench located between the first aperture and the second aperture;

an organic layer which covers the second insulating layer, the first lower electrode located in the first aperture and the second lower electrode located in the second aperture, and including a light emitting layer; and an upper electrode which covers the organic layer, wherein the first trench comprises:

a first trench portion including a bottom surface and a first side surface and a second side surface rising from the bottom surface;

a second trench portion located above the first trench portion and including a first bottom portion extending from the first side surface to an outer side of the first trench, a second bottom portion extending from the second side surface to an outer side of the first trench, a third side surface rising from the first bottom portion, and a fourth side surface rising from the second bottom portion; and a third trench portion located above the second trench portion and including a third bottom portion extending from the third side surface to an outer side of the first trench, a fourth bottom portion extending from the fourth side surface to an outer side of the first trench, a fifth side surface rising from the third bottom portion, and a sixth side surface rising from the fourth bottom portion, a first gap between the first side surface and the second side surface in a lower portion of the first trench portion is greater than a second gap between the first side surface and the second side surface in an upper portion of the first trench portion, a third gap between the third side surface and the fourth side surface in a lower portion of the second trench portion is greater than a fourth gap between the third side surface and the fourth side surface in an upper portion of the second trench portion, a fifth gap between the fifth side surface and the sixth side surface in a lower portion of the third trench portion is greater than a sixth gap between the fifth side surface and the sixth side surface in an upper portion of the third trench portion, the third gap is greater than the first gap and less than the fifth gap, and the fourth gap is greater than the second gap and less than the sixth gap.

2. The display device of claim 1, wherein the organic layer comprises a lower layer, a middle layer and an upper layer, stacked one on another, the lower layer includes a first lower layer portion which covers a first surface of the second insulating layer located between the first trench and the first aperture, a second lower layer portion located in the third bottom portion, a third lower layer portion located in the first bottom portion, and a fourth lower layer portion located in the bottom surface, the middle layer comprises a first middle layer portion which continuously covers the first lower layer portion and the second lower layer portion, a second middle layer portion which overlaps the third lower layer portion, and a third middle layer portion which overlaps the fourth lower layer portion, the upper layer comprises a first upper layer portion which continuously covers the first middle layer portion and the second middle layer portion, and a second upper layer portion which overlaps the third middle layer portion, the first lower layer portion, the second lower layer portion, the third lower layer portion, and the fourth lower layer portion are separated from each other, the first middle layer portion, the second middle layer portion, and the third middle layer portion are separated from each other, and the first upper layer portion and the second upper layer portion are separated from each other.

3. The display device of claim 2, wherein the first lower layer portion includes a first end portion located on a side of the first trench, the first end portion is covered by the first middle layer portion, the first middle layer portion includes a second end portion located on a side of the first trench, and the second end portion is covered by the first upper layer portion.

4. The display device of claim 2, wherein the lower layer comprises a fifth lower layer portion located in the second bottom portion, a sixth lower layer portion located in the fourth bottom portion, and a seventh lower layer portion which covers a second surface of the second insulating layer located between the first trench and the second aperture, the middle layer comprises a fourth middle layer portion which overlaps the fifth lower layer portion and a fifth middle layer portion which continuously covers the sixth lower layer portion and the seventh lower layer portion, the upper layer comprises a third upper layer portion which continuously covers the fourth middle layer portion and the fifth middle layer portion, the fourth lower layer portion, the fifth lower layer portion, the sixth lower layer portion and the seventh lower layer portion are separated from each other, the third middle layer portion, the fourth middle layer portion and the fifth middle layer portion are separated from each other, and the second upper layer portion and the third upper layer portion are separated from each other.

5. The display device of claim 4, wherein the seventh lower layer portion includes a third end portion located on a side of the first trench, the third end portion is covered by the fifth middle layer portion, the fifth middle layer portion includes a fourth end portion located on a side of the first trench, and the fourth end portion is covered by the third upper layer portion.

6. The display device of claim 4, wherein the upper electrode is in contact with the first upper layer portion, the second upper layer portion, the third upper layer portion, the second middle layer portion, the third middle layer portion, the fourth middle layer portion, the third lower layer portion, the fourth lower layer portion and the fifth lower layer portion, inside the first trench.

7. The display device of claim 2, wherein the light emitting layer is any one of the lower layer, the middle layer and the upper layer.

8. The display device of claim 1, wherein the first trench portion has a first depth, the second trench portion has a second depth, the third trench portion has a third depth, and the second depth is less than the first depth and greater than the third depth.

9. The display device of claim 1, wherein the organic layer includes a first portion which covers the first lower electrode located in the first aperture and covers a first surface of the second insulating layer located between the first trench and the first aperture, a second portion which covers the second lower electrode located in the second aperture and covers a second surface of the second insulating layer located between the first trench and the second aperture, and a third portion disposed on the bottom surface of the first trench and separated from the first portion and the second portion.

10. The display device of claim 9, wherein the first portion, the second portion and the third portion include the light emitting layer of a same color.

11. The display device of claim 1, wherein the second insulating layer further includes a second trench located on an opposite side to the first trench while interposing the first aperture therebetween, a third trench and a fourth trench connected to both the first trench and the second trench, respectively, and the third trench is located on an opposite side to the fourth trench while interposing the first aperture therebetween.

12. The display device of claim 1, further comprising:

a display area which displays images, and a non-display area surrounding the display area;

a power line located in the non-display area; and a peripheral electrode located in the non-display area and electrically connected to the power line, wherein the second insulating layer covers the peripheral electrode, and the upper electrode is connected to the peripheral electrode via a contact hole formed in the second insulating layer in the non-display area.

13. The display device of claim 1, wherein the organic layer further includes at least one of a hole injection layer, a hole transport layer, an electron injection layer, and an electron transport layer.

14. The display device of claim 1, wherein the first trench penetrates the second insulating layer to the first insulating layer.

* * * * *